(12) United States Patent
Heo

(10) Patent No.: US 12,695,072 B2
(45) Date of Patent: Jul. 28, 2026

(54) PLASMA IGNITION VALIDATION IN A PLASMA-ASSISTED WAFER PROCESS BACKGROUND

(71) Applicant: ASM IP Holding, B.V., Almere (NL)

(72) Inventor: BeomGyu Heo, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 540 days.

(21) Appl. No.: 18/333,359

(22) Filed: Jun. 12, 2023

(65) Prior Publication Data

US 2023/0402270 A1 Dec. 14, 2023

Related U.S. Application Data

(60) Provisional application No. 63/358,621, filed on Jul. 6, 2022, provisional application No. 63/351,657, filed on Jun. 13, 2022.

(51) Int. Cl.
H01J 37/32 (2006.01)

(52) U.S. Cl.
CPC .................. H01J 37/32935 (2013.01); H01J 2237/24564 (2013.01); H01J 2237/332 (2013.01)

(58) Field of Classification Search
CPC ....... H01J 37/32935; H01J 2237/24564; H01J 2237/332; H01J 37/32926; H01J 37/3299; H01J 37/32146; C23C 16/45536; C23C 16/52

See application file for complete search history.

(56) References Cited

U.S. PATENT DOCUMENTS

| | | | |
|---|---|---|---|
| 8,790,743 B1 * | 7/2014 | Omori ............... | H01J 37/32935 |
| | | | 427/9 |
| 2006/0051520 A1 * | 3/2006 | Behle .................... | C23C 16/045 |
| | | | 118/723 R |
| 2009/0120580 A1 | 5/2009 | Kagoshima | |
| 2020/0144030 A1 * | 5/2020 | Prager ............... | H01J 37/32146 |
| 2021/0225622 A1 * | 7/2021 | Shoji ................. | H01J 37/32935 |

FOREIGN PATENT DOCUMENTS

| | | |
|---|---|---|
| JP | 2006083468 A | 3/2006 |
| KR | 20070032744 A | 3/2007 |

* cited by examiner

*Primary Examiner* — Zhipeng Wang
(74) *Attorney, Agent, or Firm* — Banner & Witcoff, Ltd.

(57) ABSTRACT

An apparatus for semiconductor processing may be provided. The apparatus may comprise a reactor chamber configured to process a wafer, a plasma generator to generate a plasma in the reactor chamber, a plasma control board provided with a power control to control the plasma power in the reactor chamber, and a process controller operably connected to the plasma control board and configured to set plasma parameters for the plasma in the reactor chamber. The plasma control board may comprise a plasma power measurement sensor and may be constructed and/or programmed to count both the number of plasma pulses.

14 Claims, 7 Drawing Sheets

- PRIOR ART -

PLASMA IGNITION VALIDATION IN A PLASMA-ASSISTED WAFER PROCESS BACKGROUND

TECHNICAL FIELD

The present disclosure relates to an apparatus and a method for processing a wafer with plasma, particularly to a method for controlling such processes based on plasma ignition status.

BACKGROUND

In an apparatus for processing a wafer with plasma, failure of plasma ignition may occur despite power being switched on. Since it may be difficult to obtain a film in a deposition process having targeted quality when the plasma ignition has frequent ignition failure, it may be important to monitor the status of plasma discharge, i.e., ignition.

In the case of plasma-enhanced atomic layer deposition (PEALD) equipment, plasma must be ignited on dozen to thousands of times during the process. Therefore, verification may be required whether the plasma ignitions are normal or not. There may be methods for detecting plasma ignition, for example, U.S. Pat. No. 8,790,743 discloses a PLC logger used for monitoring the plasma ignition status. The '743 patent discloses that a PLC logger monitors plasma ignition but the ignition detection may be getting more difficult since plasma pulse duration time gets shorter and shorter due to the technological advance.

Therefore, there may be provided an alternative way to monitor plasma ignition.

SUMMARY

In accordance with one embodiment, an apparatus for semiconductor processing may be provided, the apparatus may comprise: a reactor chamber configured to process a wafer; a plasma generator provided to the reactor chamber to generate a plasma in the chamber; a plasma control board operably connected to the plasma generator and provided with a power control to control the plasma power in the reactor chamber; a process controller operably connected to the plasma control board and configured to set plasma parameters for the plasma in the reaction chamber. The plasma control board may comprise a plasma power measurement sensor and may be constructed and/or programmed to count both the number of plasma pulses whose plasma power enters into a plasma power valid range when the plasma power goes up through a plasma power low threshold and the number of plasma pulses whose plasma power enters into a plasma power valid range when the plasma power goes down through a plasma power high threshold.

The plasma control board may be further configured to transmit the result of the plasma pulses count to the process controller.

The process controller may be configured to set off an alarm if the result of the plasma pulse count is either below a predetermined value range or above the predetermined value range.

The process controller may be configured to adjust the plasma parameters.

In accordance with another embodiment, a semiconductor processing method in an apparatus comprising a reactor chamber configured to process a wafer, a plasma generator provided to the reactor chamber to generate a plasma in the chamber, a plasma control board comprising a plasma power measurement sensor, and the plasma control board operably connected to the plasma generator and provided with a power control to control the plasma power in the reactor chamber, and a process controller operably connected to the plasma control board and configured to set plasma parameters for the plasma in the reaction chamber, the method comprising: setting the plasma parameters from recipe or operator input; sensing and counting the number of good pulses in the plasma power; deciding whether the counted number of good pulses is within a predetermined value range or not.

The method may further comprise setting an alarm if it is decided that the resulting number of good ignition is not within the predetermined acceptable range.

The method may further comprise: adjusting the plasma parameters.

DETAILED DESCRIPTION

Figure 1:
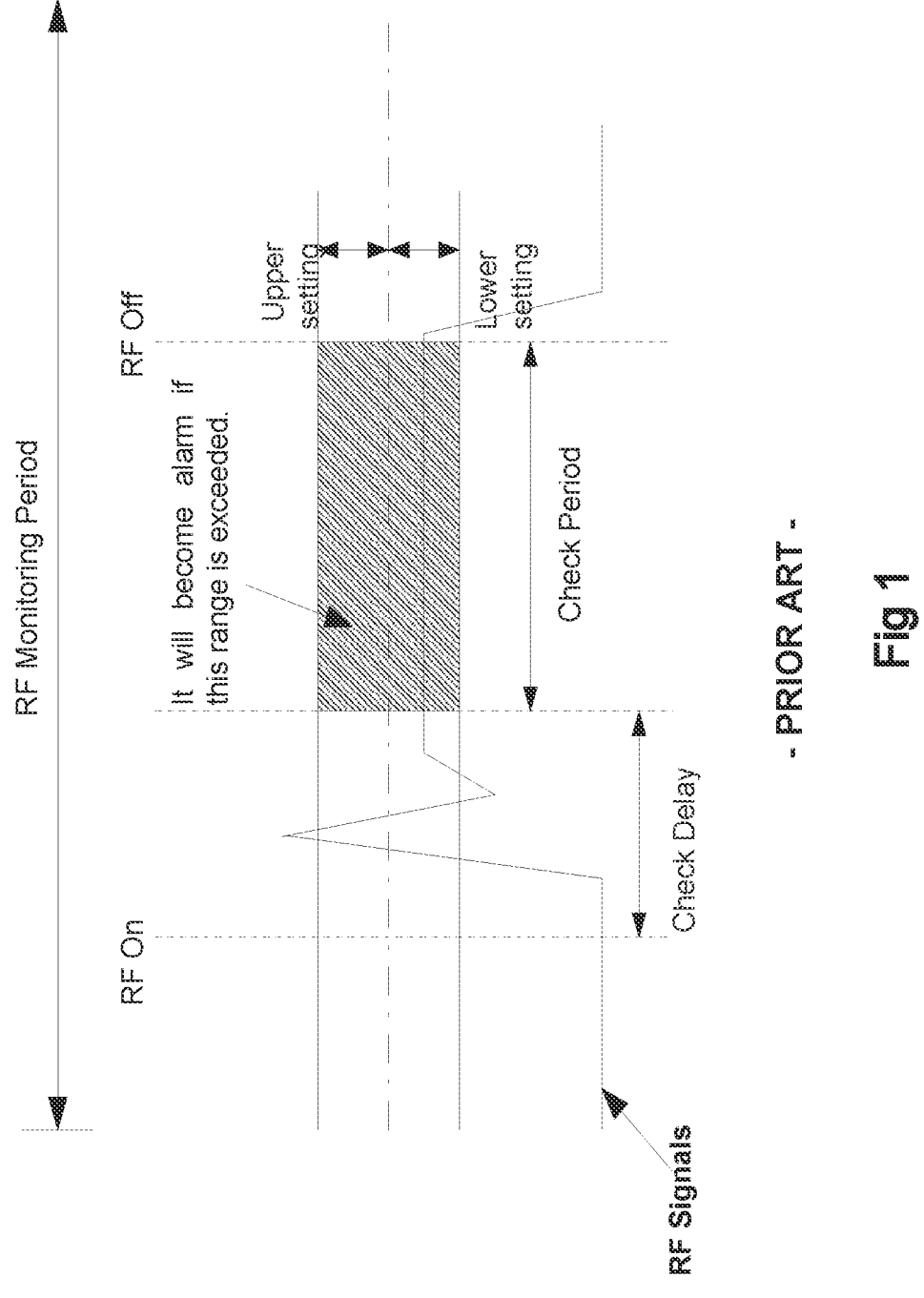
FIG. 1. is a conceptual diagram showing how plasma ignition monitoring may be done.

Plasma-assisted wafer process may include a PEALD process, a cyclic PECVD process, a cyclic plasma-assisted etching process, etc., wherein plasma power is applied in the process in pulses to accomplish an intended process such as a process of depositing a film or layer on a wafer, and a process of etching a same film or layer on a wafer.

In this specification, plasma power may be plasma forward power. Plasma forward power means the power which is actually dissipated in the wafer processing.

Due to recent advancement in semiconductor technology, more frequent plasma turn-ons may be needed in wafer processes, like PEALD and PECVD for example. To ensure the wafer quality, the plasma ignition may be monitored.

FIGS. 2-5 show how the embodiments may work with examples.

The difference between the value of high threshold 21, 31, 41, 51 and the value of low threshold 22, 32, 42, 52 may consist of valid range 23, 33, 43, 53. Also the value of target plasma power 24, 34, 44, 54 indicate the standard plasma power level which may be set to attain the plasma-assisted wafer process. High threshold 21, 31, 41, 51 and low threshold 22, 32, 42, 52 as well as target plasma power 24, 34, 44, 54 are parameters that may be set by controller from recipe or operator input.

In FIGS. 2-5, the unit measure of x-axis is time (s or ms) and that of y-axis is power (in Watt). The plasma power in FIGS. 2-5 indicated by "base power" is usually zero (0), meaning Watt. This plasma power rises when it is necessary for wafer process with time.

Figure 2:
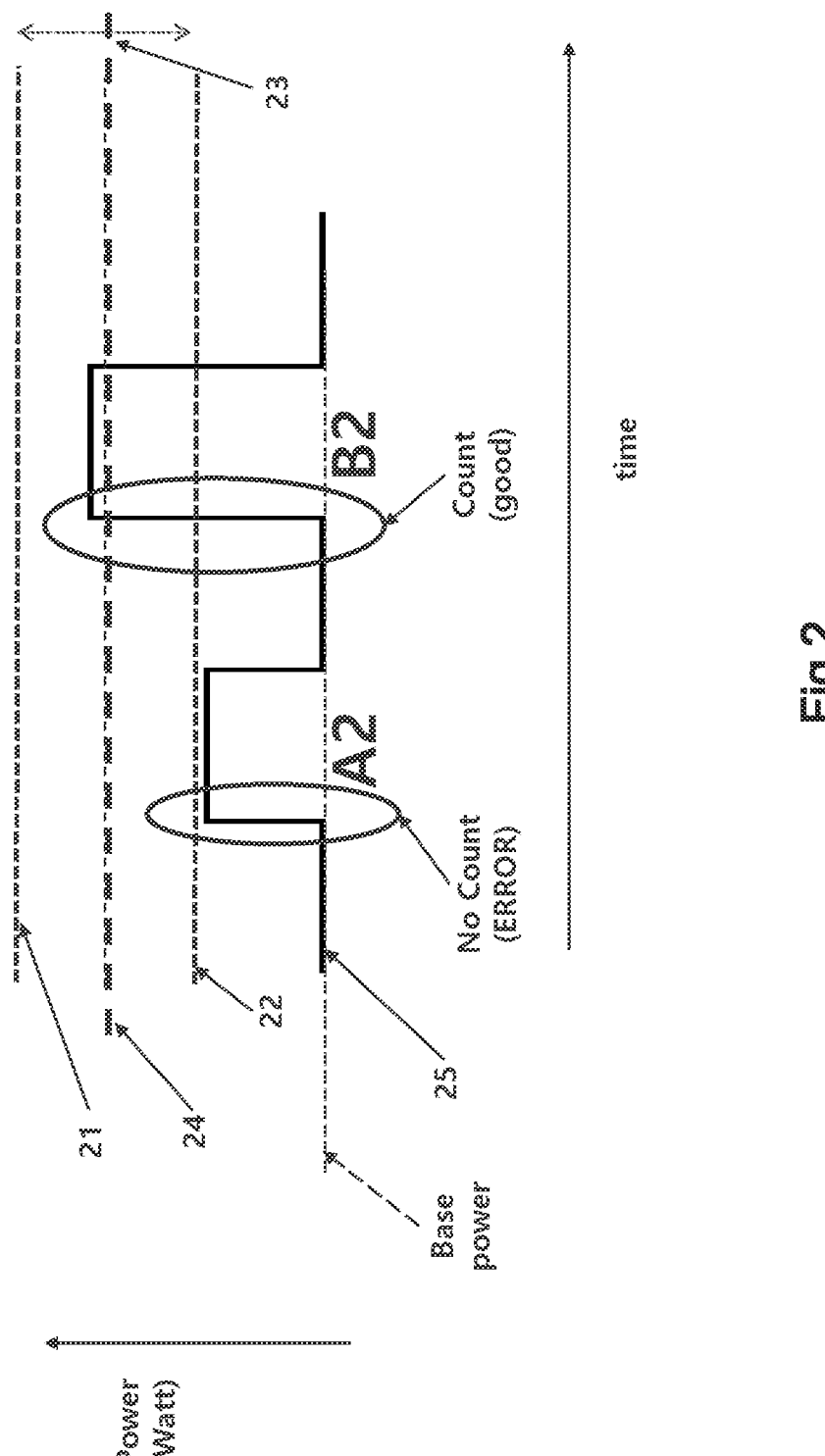
FIG. 2. shows an example when a plasma power is counted as a good ignition and when it is considered an error and not counted according to an embodiment.

In FIG. 2, the generated plasma power 25 is monitored. At A2, the plasma power 25 is generated but it doesn't go up through low threshold 22. This means that at A2 the plasma power should go up to be within range 23. Therefore, A2 may be considered as error plasma power and it may not be counted as a good ignition. At B2, the plasma power 25 goes up through low threshold 22. This may be considered as good ignition and it may be counted. When counted (i.e., good) then good ignition number may be increased by 1. Initially, the number of good ignition may be set to 0 (zero) when this validation starts. FIG. 2's example A2 shows a case when plasma power 25 does not go up above the low threshold 22 (lower than the valid range 23) and which is considered an error plasma ignition.

Figure 3:
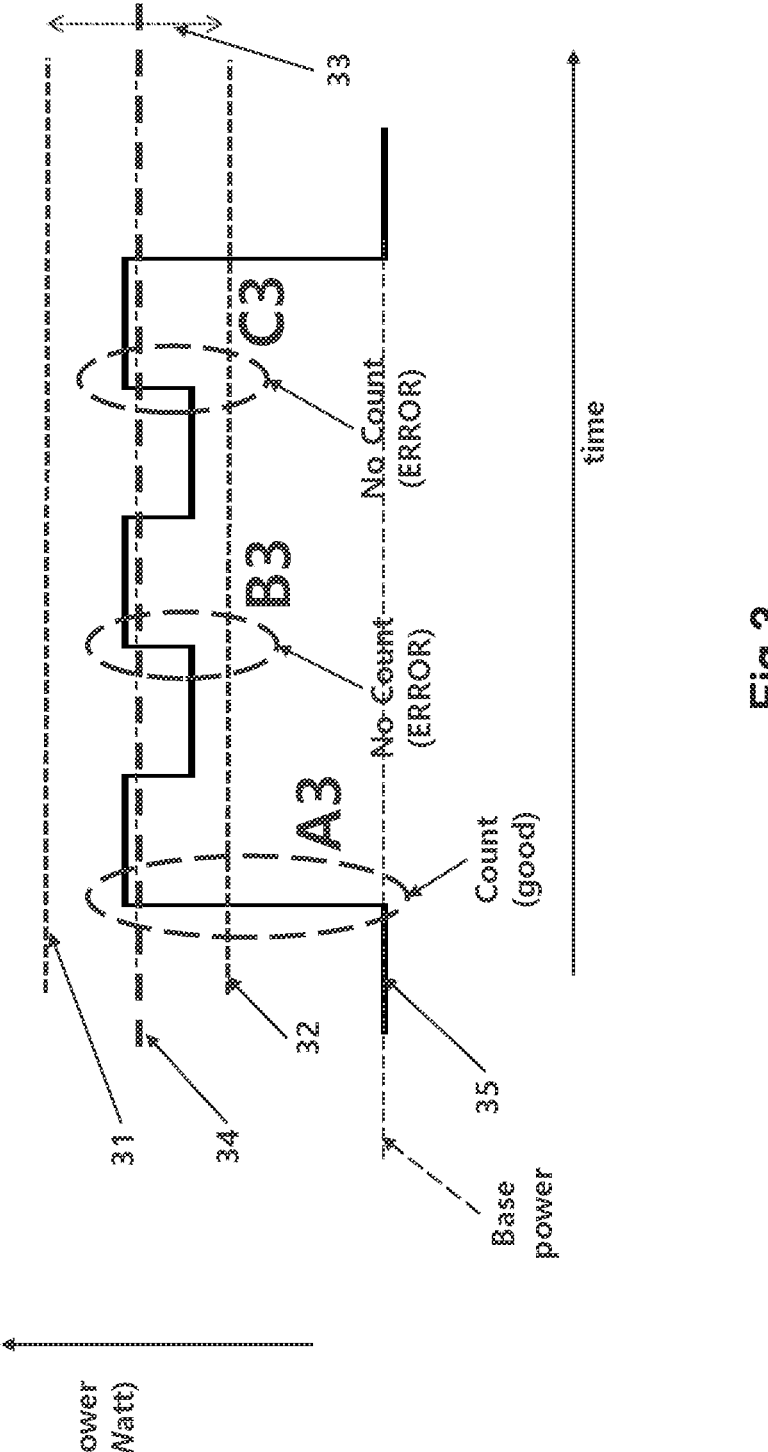
FIG. 3. shows another example when a plasma power is counted as a good ignition and when it is considered an error and not counted according to an embodiment.

In FIG. 3, the plasma power 35 is generated and monitored. At A3, the plasma power goes up through low threshold 32. This may be considered as 'good' and it may be counted. However, just before B3 and C3, the plasma power 35 should be down below the low threshold 32 and it should bounce upward within the plasma valid range 33 at B3 and C3. But in each occasion, the plasma power 35 doesn't go below the low threshold 32. So, B3 and C3 are considered error plasma ignition and the drop and rise-up within the plasma valid range may not be counted as good ignition.

Figure 4:
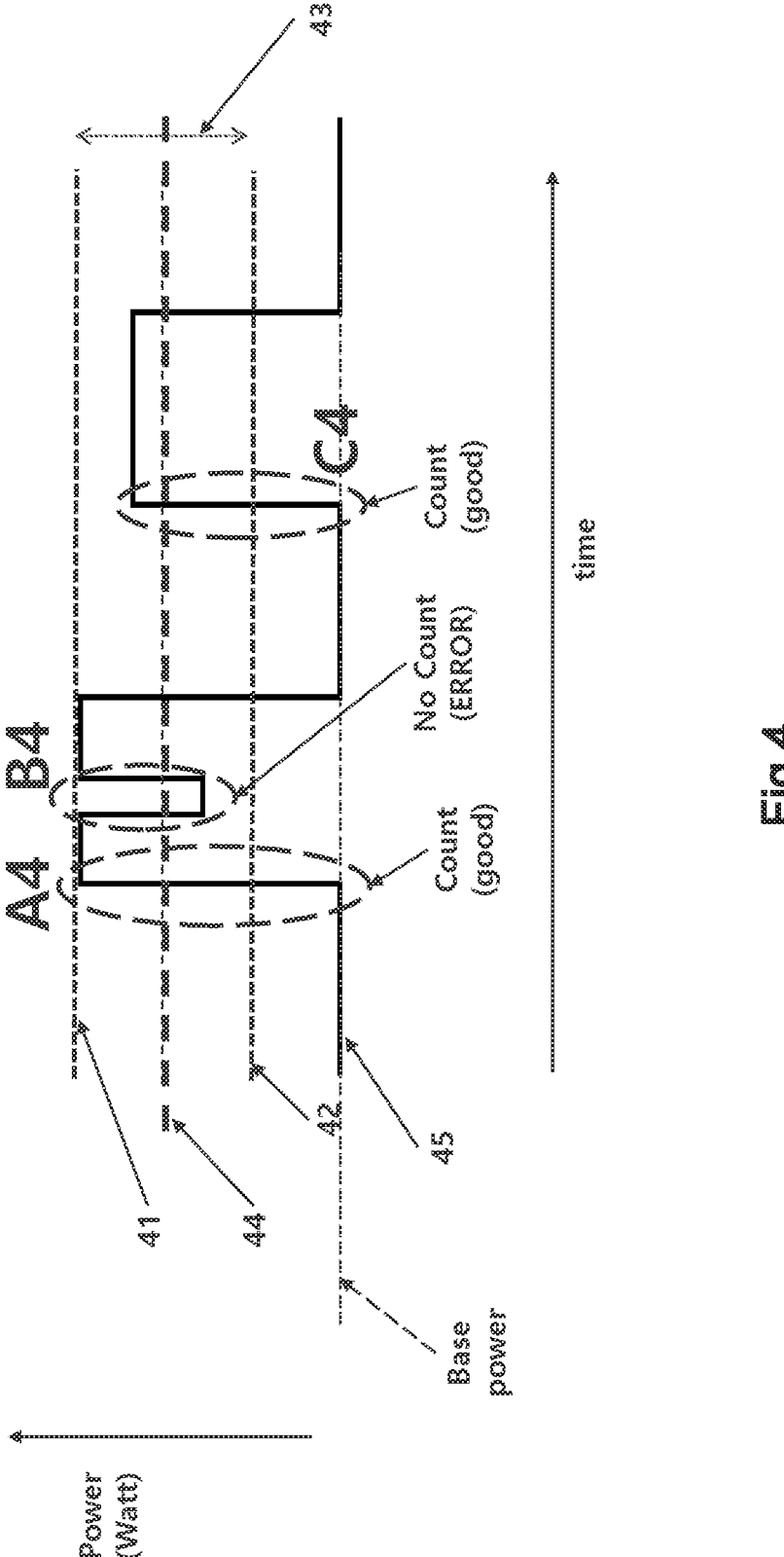
FIG. 4. shows another example when a plasma power is counted as a good ignition and when it is considered an error and not counted according to an embodiment.

In FIG. 4, the generated plasma power 45 is monitored. At A4 and C4 the plasma power 45 goes up through the low threshold 42 and they are considered good and counted. However, at B4 there exists a not-scheduled plasma power drop and it is considered error so it doesn't be counted as good ignition. It must be noted that even though B4 is considered an error but the quality of wafer in this time window does not deteriorate because the plasma level stays within the valid range 43.

Figure 5:
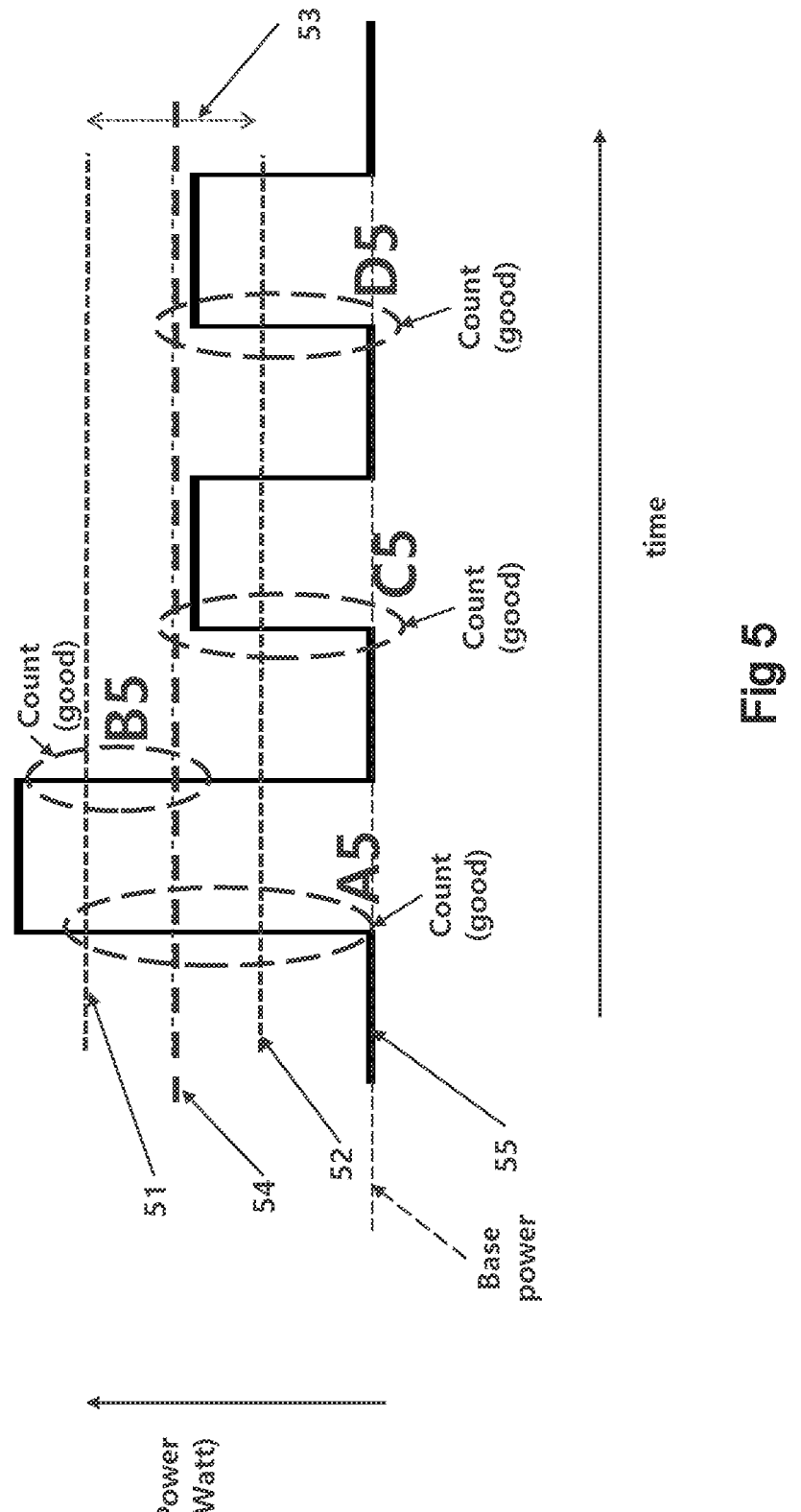
FIG. 5. Shows another example when a plasma power is counted as a good ignition and when it is considered an error and not counted according to an embodiment.

In FIG. 5, the generated plasma power 55 is monitored. At A5, C5 and D5 the plasma power 55 goes up through the low threshold 52 and they are considered good and counted good. In B5, plasma power 55 goes down through the high threshold 51 and though strange it is considered good and may be counted good because the plasma power level in this occasion (B5) goes into the valid range 53.

Figure 7:
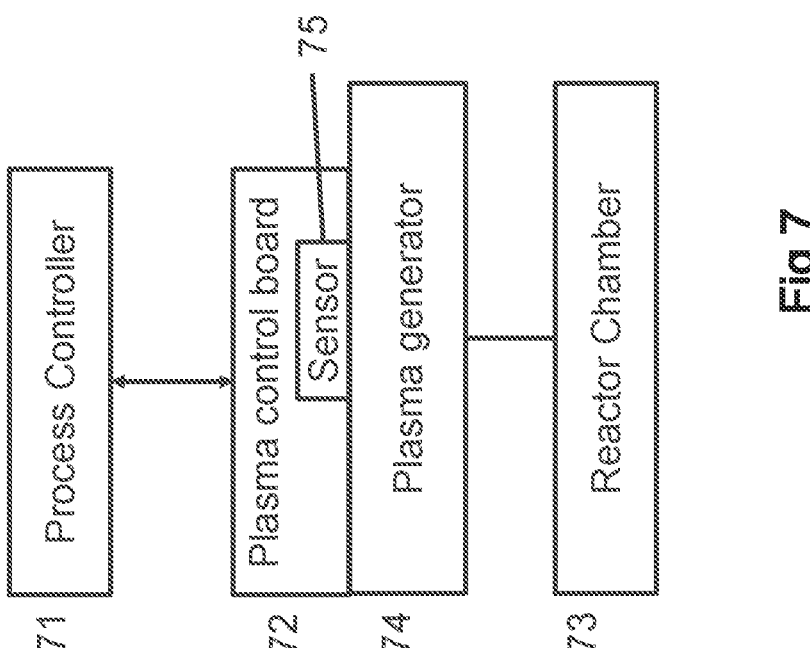
FIG. 7. depicts an apparatus according to an embodiment.

The apparatus of the present disclosure is shown in FIG. 7.

Process controller 71, which may be a Personal Computer or a console or terminal or mobile device may set the parameters such as plasma power 24, 34, 44, 54, and high threshold 21, 31, 41, 51, and low threshold 22, 32, 42, 52. The parameters may be input from operator or process recipe. Process controller 71 also may reset the good ignition number to 0 (zero). This good ignition number may be increased in good cases explained in the previous examples of FIGS. 2-5. Reactor chamber 73 may be the target to be measured of plasma ignition.

Plasma control board 72 may be used to count the plasma pulses during processes. The plasma control board 72 is provided to the plasma generator 74 and also comprises a plasma power measurement sensor 75 which is configured to sense the plasma generator 74's plasma power. As previously mentioned, this is mainly due to the advancement of plasma-assisted process technology which uses a shorter and more frequent plasma pulses so monitoring the short-paced plasma ignition closer to the reactor may be necessary. The plasma power measurement sensor 75 may be an electrical power gauge or power meter since the generated plasma may be measured in Watt as shown in FIGS. 2-5.

The process controller 71 also may decide whether the number of good ignition (which may be the result of good ignition counts shown in FIGS. 2-5) may be acceptable or not and set off an alarm when not acceptable. In this disclosure, alarm may mean not only some kind of warning to be displayed or sounded but also any kind of process stop or termination.

The controller 71 also may reset the number of good ignition to zero (0), set the parameters (i.e., high threshold, low threshold, target plasma power, acceptable range of the good ignition number for setting off the alarm) and send the parameters to the board 72. The controller 71 may also receive the result number of good ignition and decide whether the resulting good ignition number may be within acceptable range or not and set off alarm if needed. The board 72, more specifically the plasma power measurement sensor 75 may monitor the plasma generator 74 and when condition is met, the board increases the number of good ignition by 1.

The plasma power measurement sensor 75 may be a wattmeter which measures power in Watt.

Figure 6:
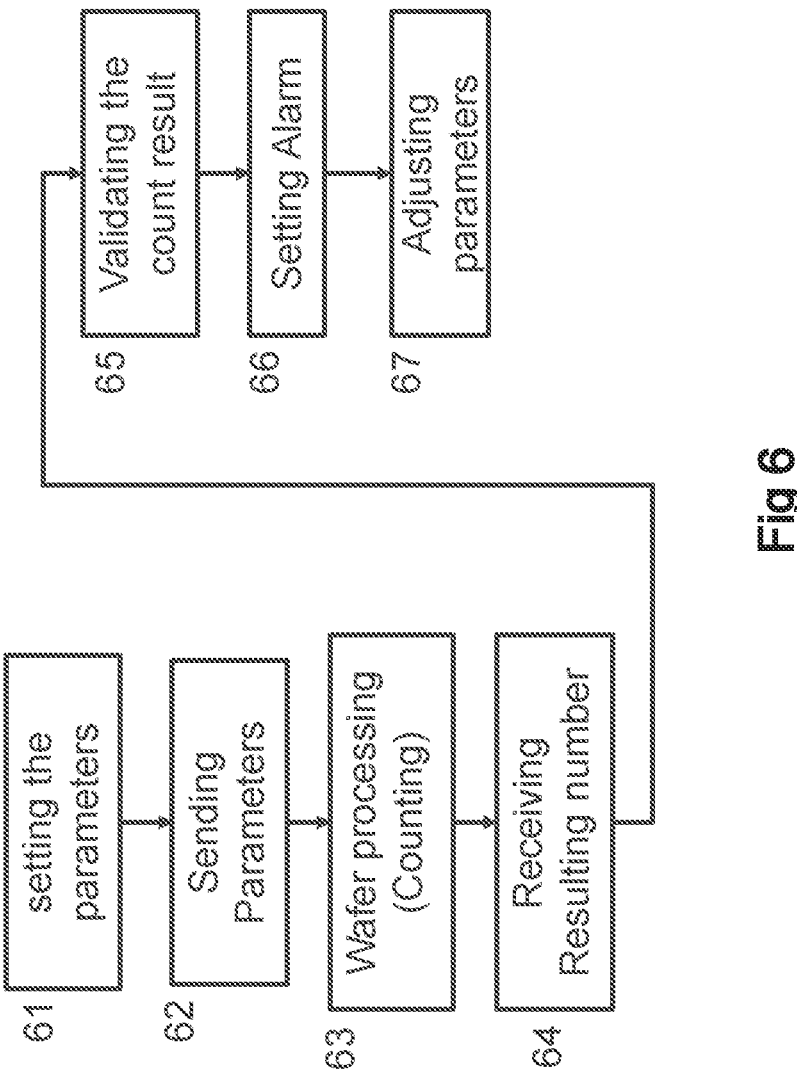
FIG. 6. depicts a method of plasma ignition validation according to an embodiment.

The present disclosure's method of plasma ignition validation is depicted in FIG. 6.

The process controller 71 may set (61) and send the parameters to the plasma control board 72 (62). The board 72 may monitor plasma power and count good ignitions (63). When wafer processing finishes, the board 72 may send the resulting good ignition number to the process controller 71 (64). The controller 71 may validate the resulting good ignition number and decide whether to validate it (65). If the controller 71 may decide that the good ignition count is not within the acceptable range of good ignition number, then it may set off an alarm (66).

The controller 71 may adjust the parameters to reflect the result of previous wafer plasma process (67). This adjustment may be 1) make the acceptable good ignition range wider or narrower, 2) change the level of high threshold, low threshold, and/or the target plasma power. This adjustment can be applied to the next round of wafer processing for better quality.

Adjusting the parameters (67) and setting off alarm (66) may be executed independently of each other.

Another embodiment of the present disclosure includes a non-transitory, computer-readable and tangible medium, which can be executed by a processor of a computer system so that the methods explained above (FIG. 6) can be carried out by the computer system's processor.

The present disclosure proposes a method for preserving the quality of wafer from plasma-assisted processes. It can check whether plasma ignition is normal or not. And then decide whether there is any need to stop the next process. Therefore, it has the advantage of preventing process failure and maintain wafer quality by checking plasma ignition.

In this disclosure the plasma power may be sensed with wattmeter and measured in Watt. However, plasma can be measured and sensed with temperature, density, spectrum, and plasma potential and other ways besides in Watt. Even though the measurement unit is changed, the main principle except the sensor 75 remains the same.

For example, if temperature is used instead of Watt, then the sensor 75 may be a thermometer and the plasma valid range 23, 33, 43, 53 may be measured in degrees of Celsius (° C.) or Fahrenheit (° F.). But it should be noted that the main principle of this disclosure remains the same.

In addition to the above, as the ALD process evolves, the plasma on time is getting shorter and shorter, so plasma on detection is often not possible on Windows OS PCs. Therefore, the present disclosure has the advantage of being able to detect plasma ignition even if the plasma time is short with a plasma control board. Also, plasma ignition can be validated even though plasma is not on due to any problem. This is due to the fact that the number of good ignition cannot be increased if there is no plasma power and too low or zero (0) value of good ignition may not be within the acceptable range of good ignition.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

The invention claimed is:

1. An apparatus for semiconductor processing, the apparatus comprising:
   a reactor chamber configured to process a wafer;
   a plasma generator provided to the reactor chamber to generate a plasma in the reactor chamber;
   a plasma control board operably connected to the plasma generator and provided with a power control to control plasma power in the reactor chamber; and
   a process controller operably connected to the plasma control board and configured to set plasma parameters for the plasma in the reactor chamber,
   wherein the plasma control board comprises a plasma power measurement sensor and is constructed and programmed to determine a count of both a number of plasma pulses having the plasma power enter into a plasma power valid range when the plasma power goes up through a plasma power low threshold and a number of plasma pulses having the plasma power enter into the plasma power valid range when the plasma power goes down through a plasma power high threshold.

2. The apparatus according to claim 1, wherein the plasma control board is further configured to transmit the count to the process controller.

3. The apparatus according to claim 1, wherein the process controller is configured to set off an alarm in response to the count being below a predetermined value range and in response to the count being above the predetermined value range.

4. The apparatus according to claim 1, wherein the process controller is configured to adjust the plasma parameters.

5. A semiconductor processing method in an apparatus comprising a reactor chamber configured to process a wafer, a plasma generator configured to generate a plasma in the reactor chamber, a plasma control board comprising a plasma power measurement sensor, and the plasma control board operably connected to the plasma generator and provided with a power control to control plasma power in the reactor chamber, and a process controller operably connected to the plasma control board and configured to set plasma parameters for the plasma in the reactor chamber, the method comprising:
   setting, with the process controller, the plasma parameters from recipe or operator input;
   sending the plasma parameters from the process controller to the plasma control board;

sensing and determining, with the plasma control board, a count of a number of good pulses in the plasma power;
   receiving, by the process controller, the count of the number of good pulses from the plasma control board; and
   determining, based on the count of the number of good pulses, whether a number of good ignitions is within a predetermined acceptable range or not,
   wherein the count of the number of good pulses includes both a number of plasma pulses having the plasma power enter into a plasma power valid range when the plasma power goes up through a plasma power low threshold and a number of plasma pulses having the plasma power enter into the plasma power valid range when the plasma power goes down through a plasma power high threshold.

6. The method according to claim 5, further comprising:
   determining that the number of good ignitions is not within the predetermined acceptable range; and
   setting an alarm in response to the determining that the number of good ignitions is not within the predetermined acceptable range.

7. The method according to claim 5, further comprising adjusting the plasma parameters.

8. A non-transitory, computer-readable, and tangible medium having stored thereon a set of instructions that, when executed by a processor of a computer system, cause the computer system to:
   set plasma parameters from recipe or operator input;
   send the plasma parameters to a plasma control board;
   cause the plasma control board to sense and determine a count of a number of good pulses in plasma power during processing of a wafer in a reactor chamber;
   receive the count of the number of good pulses from the plasma control board; and
   determine, based on the count of the number of good pulses, whether a number of good ignitions is within a predetermined acceptable range or not,
   wherein the count of the number of good pulses includes both a number of plasma pulses whose plasma power enters into a plasma power valid range when the plasma power goes up through a plasma power low threshold and a number of plasma pulses whose plasma power enters into a plasma power valid range when the plasma power goes down through a plasma power high threshold.

9. The apparatus according to claim 1, wherein the process controller is configured to display an indication that the count is outside a predetermined acceptable range.

10. The apparatus according to claim 1, wherein the process controller is configured to terminate processing of the wafer in response to the count being below a predetermined value range and in response to the count being above the predetermined value range.

11. The method according to claim 5, further comprising displaying an indication that the number of good ignitions is not within the predetermined acceptable range.

12. The method according to claim 5, further comprising terminating processing of the wafer in the reactor chamber in response to determining that the number of good ignitions is not within the predetermined acceptable range.

13. The non-transitory, computer-readable, and tangible medium according to claim 8, wherein the instructions, when executed by the processor of the computer system, cause the computer system to display an indication that the number of good ignitions is not within the predetermined acceptable range.

14. The non-transitory, computer-readable, and tangible medium according to claim 8, wherein the instructions, when executed by the processor of the computer system, cause the computer system to terminate processing of the wafer in the reactor chamber in response to determining that the number of good ignitions is not within the predetermined acceptable range.

* * * * *